United States Patent
Huffman et al.

(10) Patent No.: US 7,960,234 B2
(45) Date of Patent: Jun. 14, 2011

(54) MULTIPLE-GATE MOSFET DEVICE AND ASSOCIATED MANUFACTURING METHODS

(75) Inventors: Craig Henry Huffman, Krugerville, TX (US); Weize Xiong, Austin, TX (US); Cloves Rinn Cleavelin, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 686 days.

(21) Appl. No.: 11/726,516

(22) Filed: Mar. 22, 2007

(65) Prior Publication Data

US 2008/0233697 A1    Sep. 25, 2008

(51) Int. Cl.
*H01L 21/336* (2006.01)

(52) U.S. Cl. ........ 438/283; 438/284; 438/157; 438/706; 257/E21.409

(58) Field of Classification Search ............... 438/279, 438/283, 284, 157, 706; 257/E21.409
See application file for complete search history.

(56) References Cited

U.S. PATENT DOCUMENTS

| | | | |
|---|---|---|---|
| 5,294,563 A | 3/1994 | Rao | |
| 6,764,884 B1 | 7/2004 | Yu | |
| 6,867,433 B2 | 3/2005 | Yeo | |
| 6,946,377 B2 * | 9/2005 | Chambers | 438/588 |
| 7,187,046 B2 | 3/2007 | Wu et al. | |
| 2005/0095764 A1 | 5/2005 | Chambers et al. | |
| 2005/0233525 A1 | 10/2005 | Yeo et al. | |
| 2005/0263832 A1 | 12/2005 | Chambers | |
| 2006/0091428 A1 | 5/2006 | Yeo et al. | |
| 2006/0160312 A1 | 7/2006 | Chaudhary et al. | |

* cited by examiner

*Primary Examiner* — Jack Chen
(74) *Attorney, Agent, or Firm* — Warren L. Franz; Wade J. Brady, III; Frederick J. Telecky, Jr.

(57) ABSTRACT

One embodiment of the present invention relates to a method of fabricating a multi-gate transistor. During the method a second gate electrode material is selectively removed from a semiconductor structure from which the multi-gate transistor is formed, thereby exposing at least one surface of a first gate electrode material. The exposed surface of the first gate electrode material is deglazed. Subsequently, the first gate electrode material is removed. Other methods and devices are also disclosed.

14 Claims, 8 Drawing Sheets

MULTIPLE-GATE MOSFET DEVICE AND ASSOCIATED MANUFACTURING METHODS

FIELD OF INVENTION

The present invention relates generally to semiconductor devices and more particularly to multiple-gate MOSFET transistors and associated manufacturing methods.

BACKGROUND OF THE INVENTION

As the performance and process limitations on scaling planar transistors are reached, attention has been recently directed to transistor designs having multiple gates (e.g., three-dimensional MOS transistors). In theory, these designs provide more control over a scaled channel by situating the gate around two or more sides of the channel silicon, wherein a shorter channel length can be achieved for the same gate dielectric thickness or similar channel lengths can be used with thicker gate dielectrics.

By alleviating the short channel effects seen in traditional scaled planar transistors, multi-gate designs offer the prospect of improved transistor performance. This is due primarily to the ability to invert a larger portion of the channel silicon because the gate extends on more than one side of the channel. In practice, however, the conventional multi-gate approaches have suffered from cost and performance shortcomings, because Silicon-Over-Insulator (SOI) wafers are more expensive than ordinary silicon substrates, among other reasons.

FIGS. 1A-1E illustrate an example of a prior art manufacturing process for forming a multiple-gate transistor on an SOI wafer. As will be appreciated from these figures and the accompanying discussion, known prior art processes are unable to consistently and effectively isolate the source and drain of a multi-gate transistor from one another.

As shown in FIG. 1A, the prior art process begins with a semiconductor structure 100 from which a multi-gate transistor is formed. The structure 100 is formed over an SOI semiconductor body 101 that includes an insulating layer 102 and a substrate 104. The structure 100 includes a silicon fin 106 in which electrical carriers (i.e., electrons or holes) can propagate. A dielectric 108 is disposed about the fin 106 and separates the fin 106 from a gate electrode 110. The gate electrode 110 may include a first gate electrode layer 112 and a second gate electrode layer 114.

During processing of the transistor, a mask layer (not shown) is deposited over the second gate electrode material 114, and the unmasked portions of the second gate electrode layer are etched away, resulting in the structure shown in FIG. 1B. After the desired portions of the second gate layer 114 have been etched away, another etch 116 with different selectivity is performed to attempt to remove the first gate electrode layer 112, as shown in FIG. 1C. However, as shown in FIG. 1D, prior art processes for etching this first gate electrode layer 112 are insufficient as they to tend to leave residue 118 about the fin 106. As shown in FIG. 1E, this residue 118 is particularly detrimental to the functionality of the multi-gate transistor 120 when the residue is metal, because metal residue can cause the source 122 to be "shorted" to the drain 124. Thus, the metal residue 118 can extend continuously from the source 122 under the patterned gate electrode 110 (e.g., along the vertical surfaces of the fin) and to the drain 124. Because the metal residue 118 is continuous, the source 122 and drain 124 will be coupled to one another and the transistor 120 will not function properly.

Absent the residue 118, during operation, the source and drain associated with the fin could be selectively biased independent of one another, thus creating a potential difference between the source 122 and drain 124. Depending on whether a voltage is applied to the gate electrode 110, electrical carriers either will or will not be freed from the lattice of the fins under the gate electrode 110. Thus, in many respects, a properly constructed multi-gate transistor operates analogously to a traditional planar MOSFET, even though its structure is quite different. As mentioned, if there is residue present, a potential difference may not be able to be established between the source and drain (i.e., because they are "shorted" together), and the transistor may not function properly.

Accordingly, there remains a need for improved transistor devices and manufacturing techniques to realize the advantages of scaling while overcoming the shortcomings of traditional multi-gate transistors.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

One embodiment of the present invention relates to a method of fabricating a multi-gate transistor. During the method a second gate electrode material is selectively removed from a semiconductor structure from which the multi-gate transistor is formed, thereby exposing at least one surface of a first gate electrode material. The exposed surface of the first gate electrode material is deglazed. Subsequently, the first gate electrode material is removed.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1A:
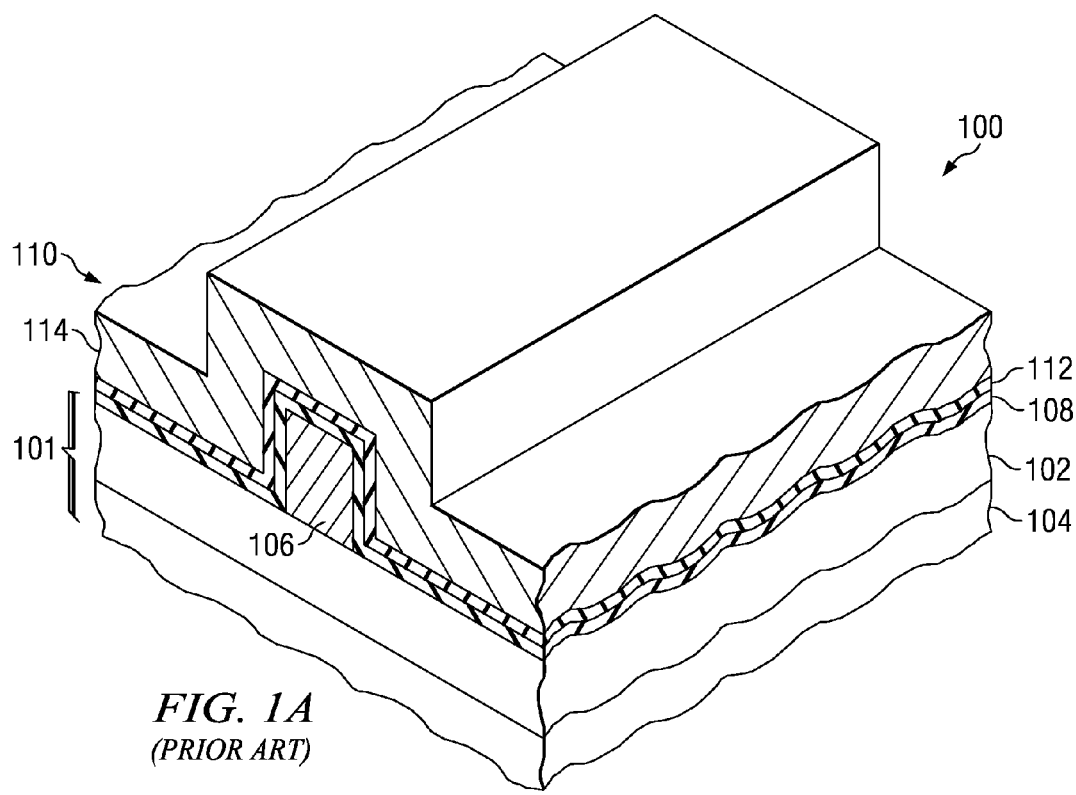
FIGS. 1A-1E illustrate a manufacturing process for a multi-gate transistor in accordance with the prior art.
Figure 1B:
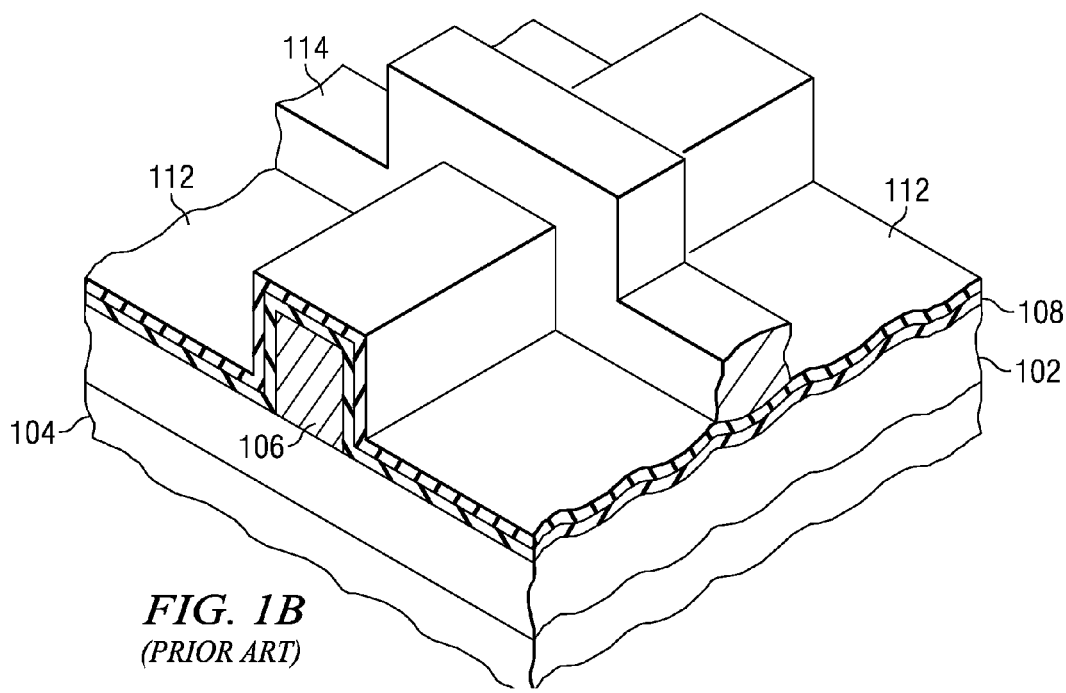
Figure 1C:
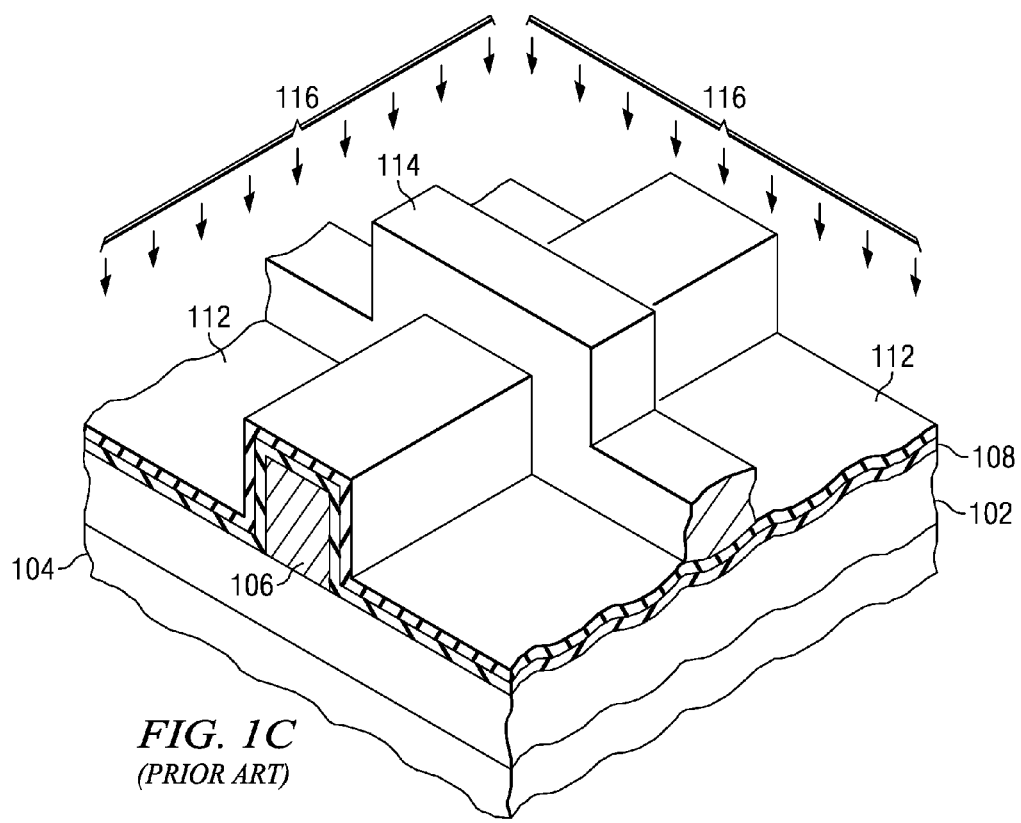
Figure 1D:
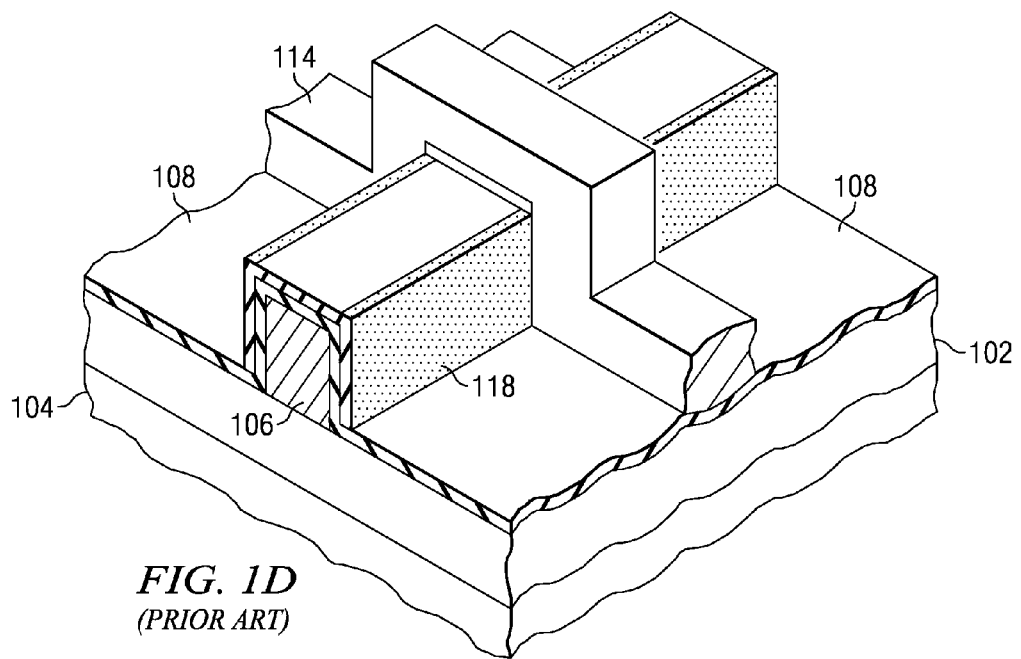
Figure 1E:
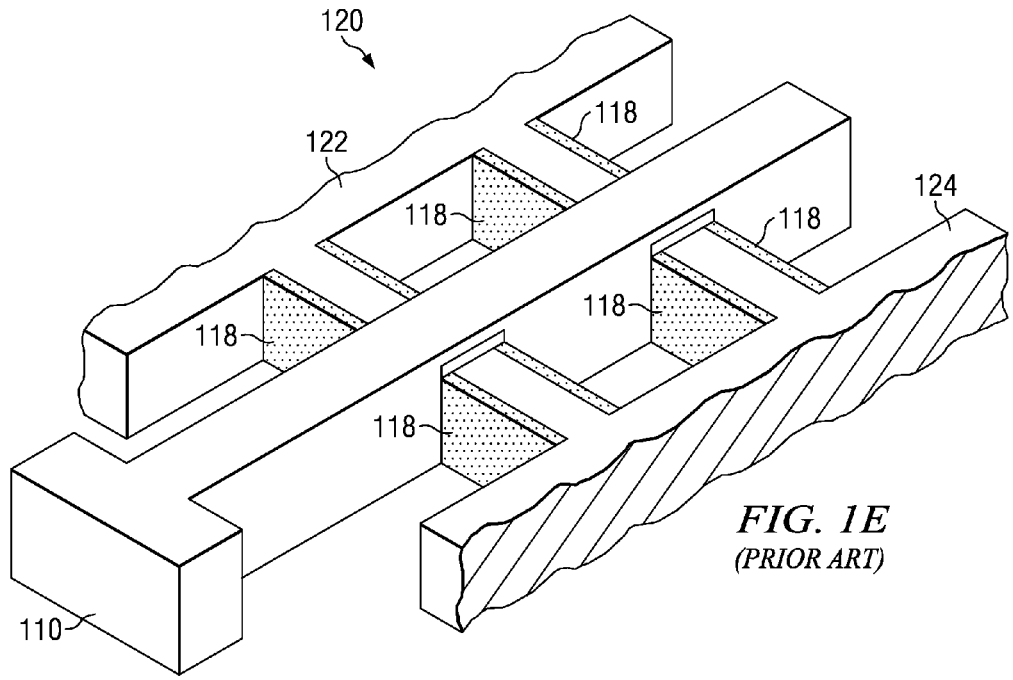

The present invention will now be described with reference to the attached drawing figures, wherein like reference numerals are used to refer to like elements throughout, and wherein the illustrated structures and devices are not necessarily drawn to scale.

Some aspects of the present invention relate to multi-gate field effect transistors, which may also be referred to as MuG-FETs. In one type of MuGFET, multiple gates may be controlled by a single gate electrode, wherein multiple gate surfaces act electrically as a single gate. In another type of MuGFET (called a multiple independent gate field effect transistor or MIGFET), multiple gates are controlled by independent gate electrodes. Various embodiments can also blend these two approaches and/or use other approaches.

Figure 2A:
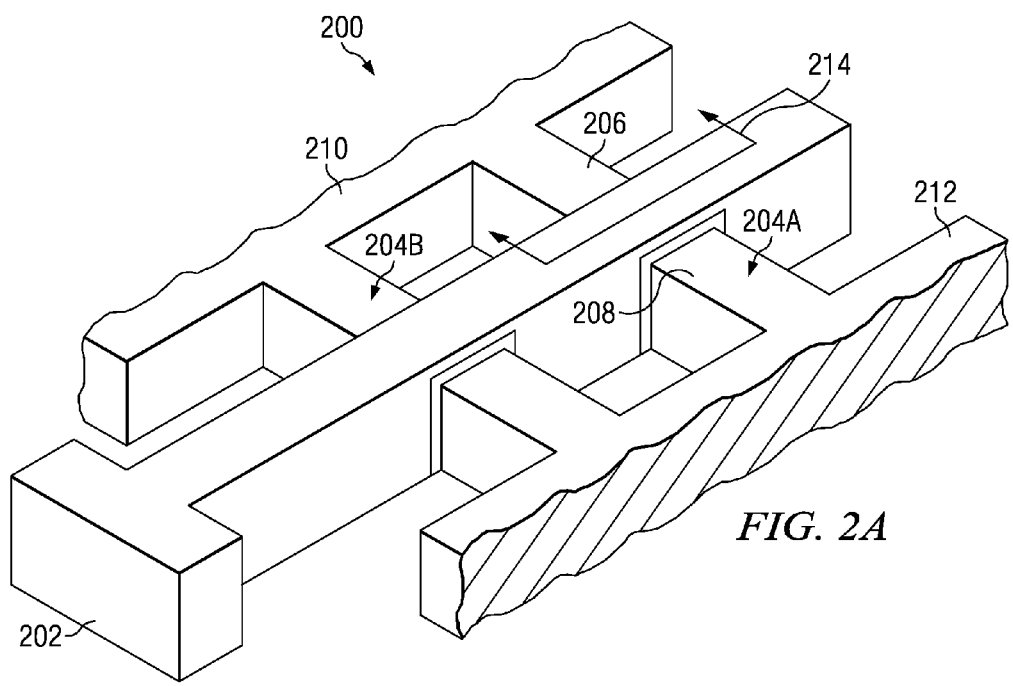
FIGS. 2A-2C illustrates one multi-gate transistor in accordance with one aspect of the present invention.
Figure 2B:
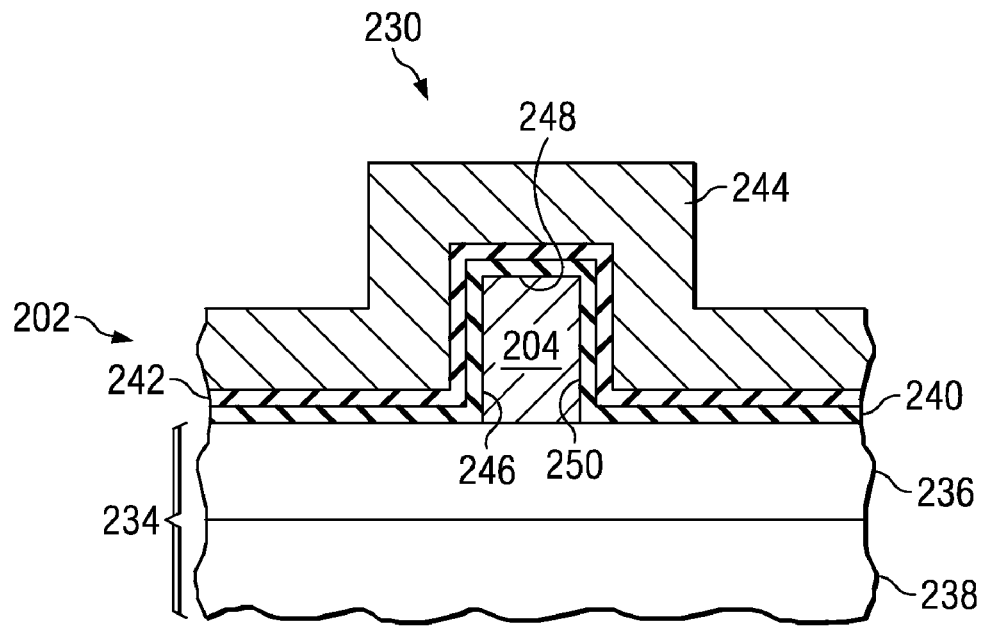
Figure 2C:
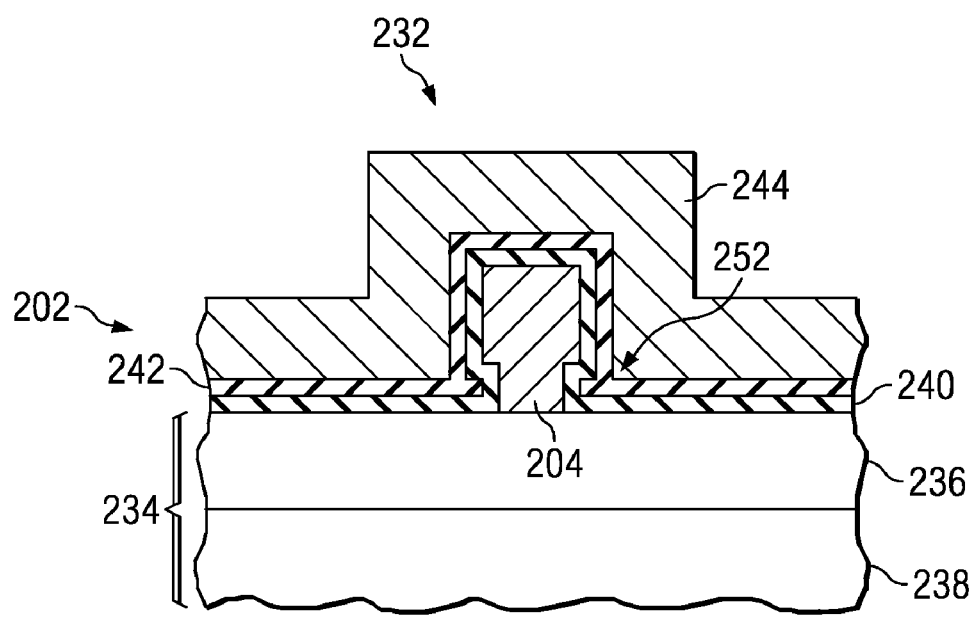

For example, FIGS. 2A-2C show a MuGFET that has multiple gate surfaces that act as a single electrical gate. In FIG. 2A, the MuGFET 200 comprises a gate electrode 202 that straddles two fins 204A, 204B. Within each fin, a source and a drain are formed such that the source and drain associated with that fin are laterally opposite one another relative to the gate electrode 202. For example, fin 204A includes a source 206 and a drain 208. A common source connection 210 and a common drain connection 212 may connect the sources and drains, respectively, of the fins in various embodiments. Although the illustrated embodiment shows two fins, it will be appreciated that other embodiments may have any number of fins (including one fin), and that other embodiments may or may not have common source connections and common drain connections.

FIGS. 2B-2C show two sample cross-sectional views of embodiments (230, 232, respectively) taken along cut-away line 214 of FIG. 2A. As generally shown, the cross sections 230, 232 include a semiconductor structure formed over a semiconductor body 234. The semiconductor body 234 comprises an insulator layer 236 and a semiconductor substrate layer 238. The semiconductor structure comprises a fin 204 that is surrounded on three sides by a dielectric layer 240, and a gate electrode 202 that is disposed over the dielectric layer 240. As shown, the gate electrode 202 may comprise two layers, namely, a first gate electrode layer 242 and a second gate electrode layer 244. The dielectric layer 240 (e.g., gate oxide) is sandwiched between the fin 204 and the gate electrode 202 and electrically separates the fin 204 from the first gate electrode layer 242. Other layers (e.g., vias, metal1, metal2, etc.), which are not shown for the purposes of simplicity, may also be formed over the gate electrode 202.

In FIG. 2B, a channel in which electrical carriers may propagate from source to drain may be created along the interface of the fin and the dielectric (i.e., along three interface surfaces 246, 248, 250). Because the interface comprises three surfaces, the channel of this MuGFET 230 is effectively wider than that of a traditional planar transistor, given equal surface areas on the wafer.

FIG. 2C shows another embodiment in which the MuG-FET is a so-called "omega-FET", so named because of its resemblance to the Greek-letter Omega. As shown in FIG. 2C's embodiment, the region of the fin nearest the insulator layer 234 is undercut 252 relative to the top portion of the fin. This embodiment yields two additional interface surfaces, and as such may result in a channel width that is even greater than the channel width in FIG. 2B. Thus, this embodiment may provide for more carriers and better performance, depending on the design constraints.

The present invention also applies to gate-all-around (GAA) transistors, and other various types of multi-gate transistors.

Figure 3:
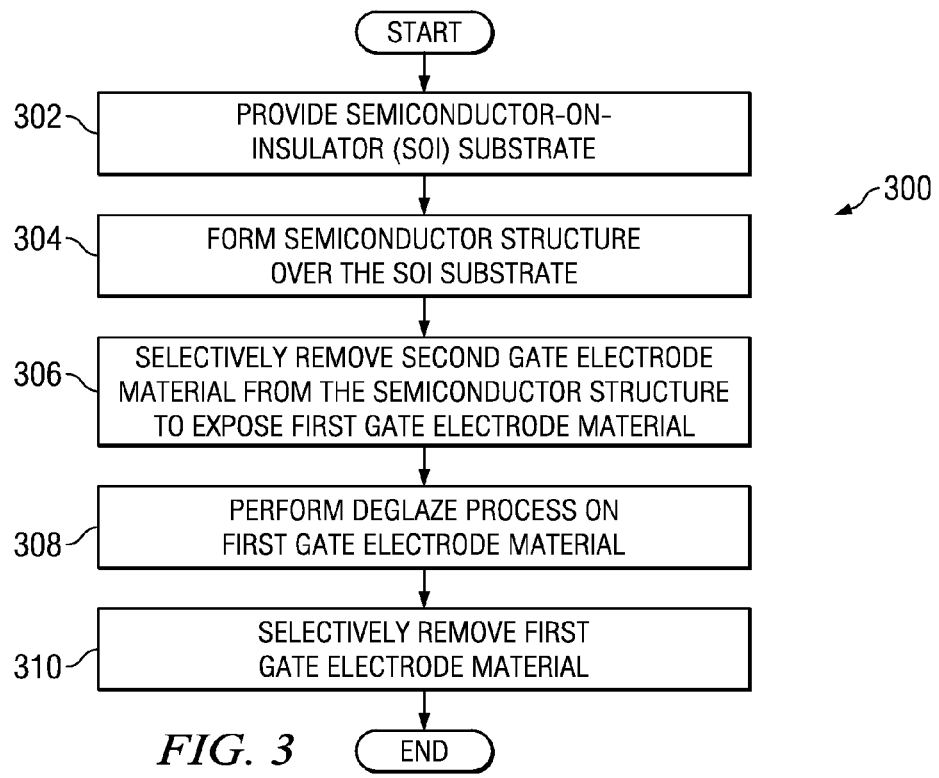
FIG. 3 illustrates a flow diagram illustrating an exemplary method for fabricating a multiple-gate transistor in accordance with an aspect of the present invention.

While the potential advantages of MuGFETs are apparent, successful fabrication of MuGFETs has been challenging to date. In order to aid in the successful fabrication of MuG-FETs, aspects of the present invention relate to methods of manufacturing MuGFETs. For illustrative purposes, a general method 300 is illustrated in FIG. 3, while a more detailed implementation is described in FIGS. 4A-4G. While these methods are illustrated and described below as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects or embodiments of the present invention. Further, one or more of the acts depicted herein may be carried out in one or more separate acts and/or phases.

Referring now to FIG. 3, method 300 starts at 302 when a semiconductor-on-insulator (SOI) substrate is provided. At 304, a semiconductor structure is formed over the SOI substrate, which semiconductor structure includes a fin, a dielectric layer, and a gate electrode that comprises at least two layers. At 306, second gate electrode material is removed from the semiconductor structure to expose first gate electrode material. At 308, a deglaze process is performed on the first gate electrode material. After the deglaze process is performed, the first gate electrode material is selectively removed at 310.

Figure 4A:
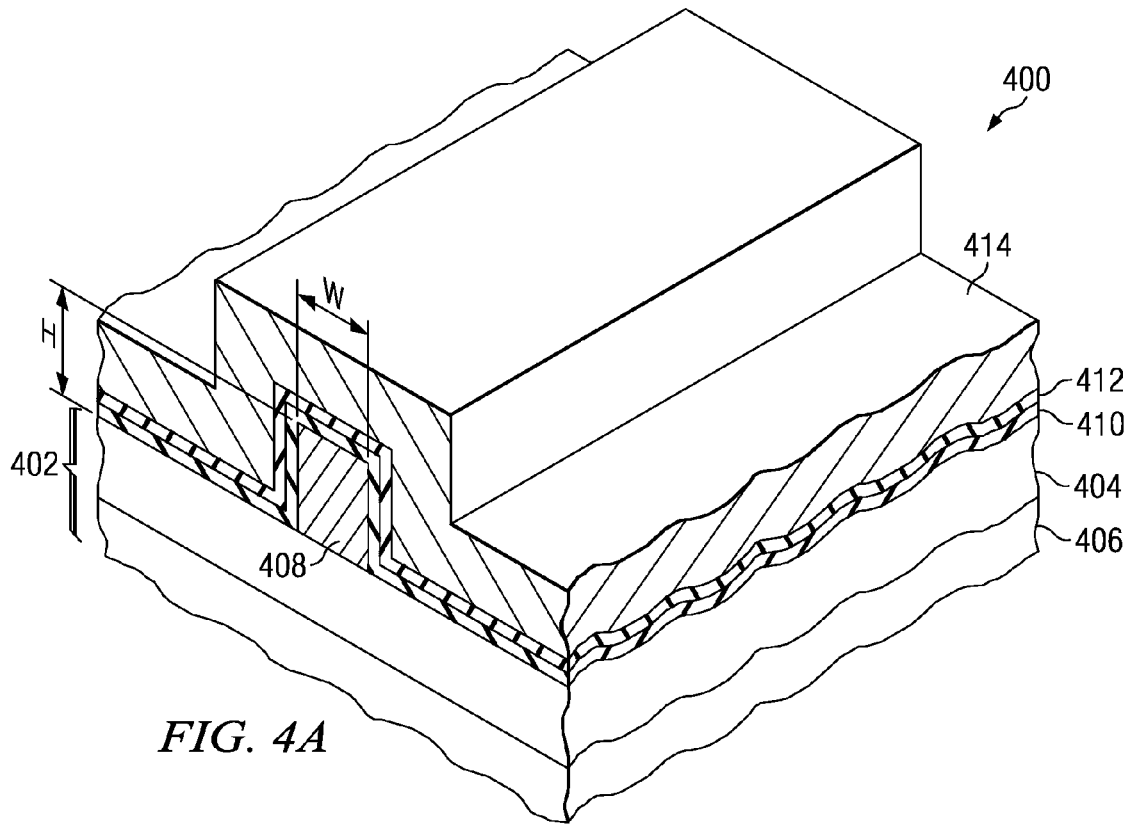
FIGS. 4A-4G illustrate various stages in an exemplary manufacturing method for fabricating a multiple-gate transistor in accordance with an aspect of the present invention.

Referring now to FIGS. 4A-4G, a more detailed process is shown with reference to schematic representations of a MuG-FET at various stages of manufacture. As shown in FIG. 4A, the more detailed process begins when a semiconductor structure 400 is formed over a semiconductor SOI body 402 that includes an insulating layer 404 and a semiconductor substrate 406. In one embodiment, the semiconductor substrate 406 comprises silicon, but in other embodiments the substrate could comprise gallium arsenide or some other semiconductor substrate. The insulator layer 404 may be formed from any dielectric or insulator, such as silicon oxide or silicon nitride, for example.

Still referring to FIG. 4A, the semiconductor structure 400 includes several layers that are successively layered on top of one another. In the illustrated embodiment, the semiconductor structure 400 includes a fin 408, a dielectric layer 410, a first gate electrode layer 412, and a second gate electrode layer 414. Other semiconductor structures could include additional layers, or need not have the four layers shown.

The fin 408 is designed to extend laterally along the top surface of the insulator layer 404. In one embodiment, the fin 408 comprises silicon, although it will be appreciated that the fin could also comprise other suitable semiconductors. Although the dimensions of the fin could vary widely depending on the specific design constraints, in one embodiment the fin has a height, h, of approximately 80 nm and a width, w, of approximately 20 nm.

The dielectric layer 410 is deposited over the fin so as to cover the top horizontal surface of the fin as well as the vertical sidewalls of the fin. The dielectric layer 410 also may extend over the top surface of the insulating layer 404 as shown in FIG. 4A. In one embodiment, the dielectric layer 410 comprises silicon oxide, although it could comprise any suitable dielectric. Although the thickness of the dielectric layer could vary widely depending on the specific design constraints, in one embodiment the dielectric layer has a thickness of approximately 2 nm.

The first gate electrode layer 412 is disposed over the dielectric layer 410 so as to substantially conform to the horizontal and vertical features present. In one embodiment, the first gate electrode layer 412 comprises a first gate electrode material, which may be a metal such as Ta, TaN, TaCN, TiN, W, WN, WSi. Metal selection is typically based on electrical workfunction of material. For typical applications, any midgap metal could be used.

The second gate electrode layer 414 is deposited over the first gate electrode layer 412 so as to substantially conform to the horizontal and vertical features present. In one embodiment, the second gate electrode layer 414 comprises a second gate electrode material such as a polycrystalline silicon (polysilicon) material.

Figure 4B:
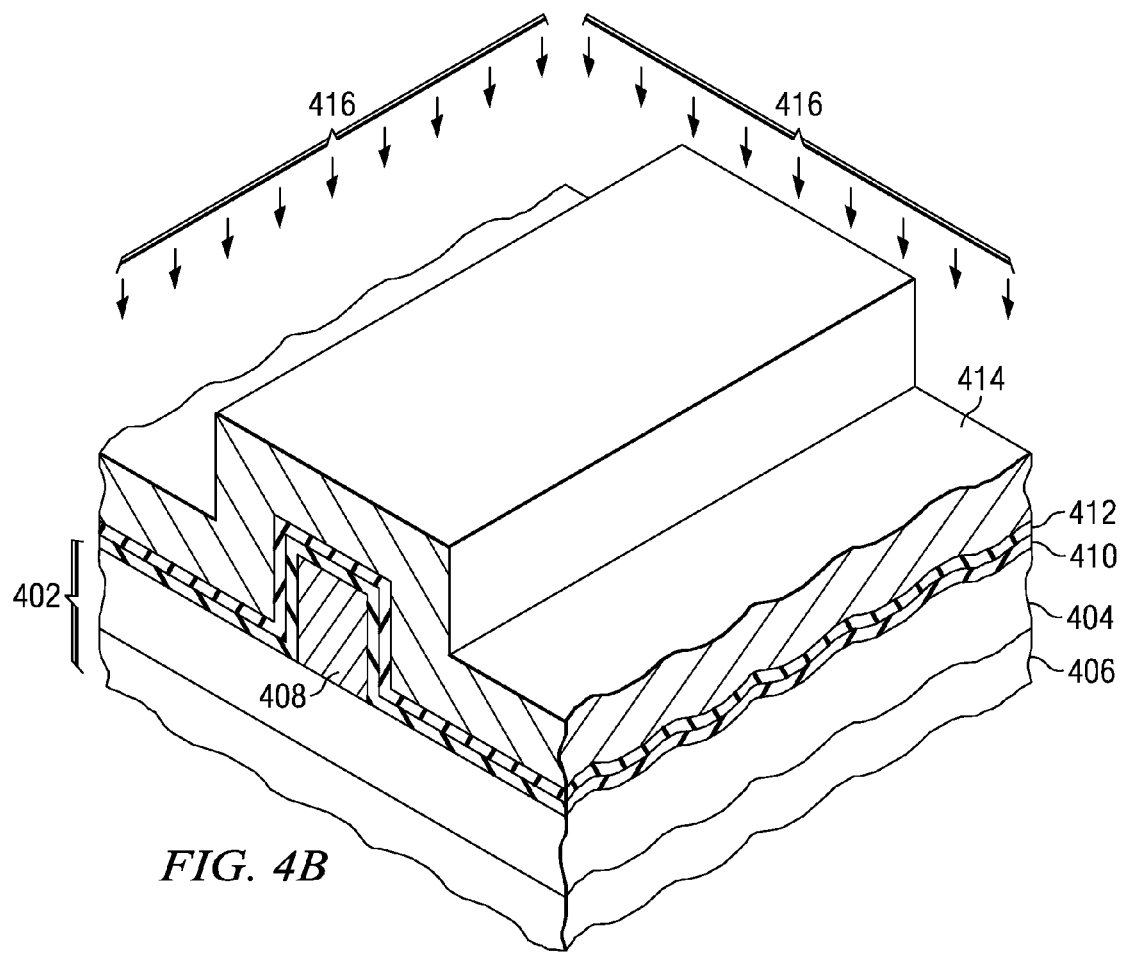

Referring now to FIG. 4B, another stage of manufacture is shown after a pattern (not shown) has been placed over the second gate electrode layer 414 and a first etch 416 is performed to remove portions of the second gate electrode. This first etch 416 may expose at least one surface of the first gate electrode. In one embodiment where the second gate electrode is polysilicon and the first gate electrode is metal, the first etch has high selectivity to metal. This high selectivity may be obtained by adding oxygen to a plasma used to etch the polysilicon. Thus, the first etch may use the first gate electrode material (e.g., a metal) as an etch stop.

Figure 4C:
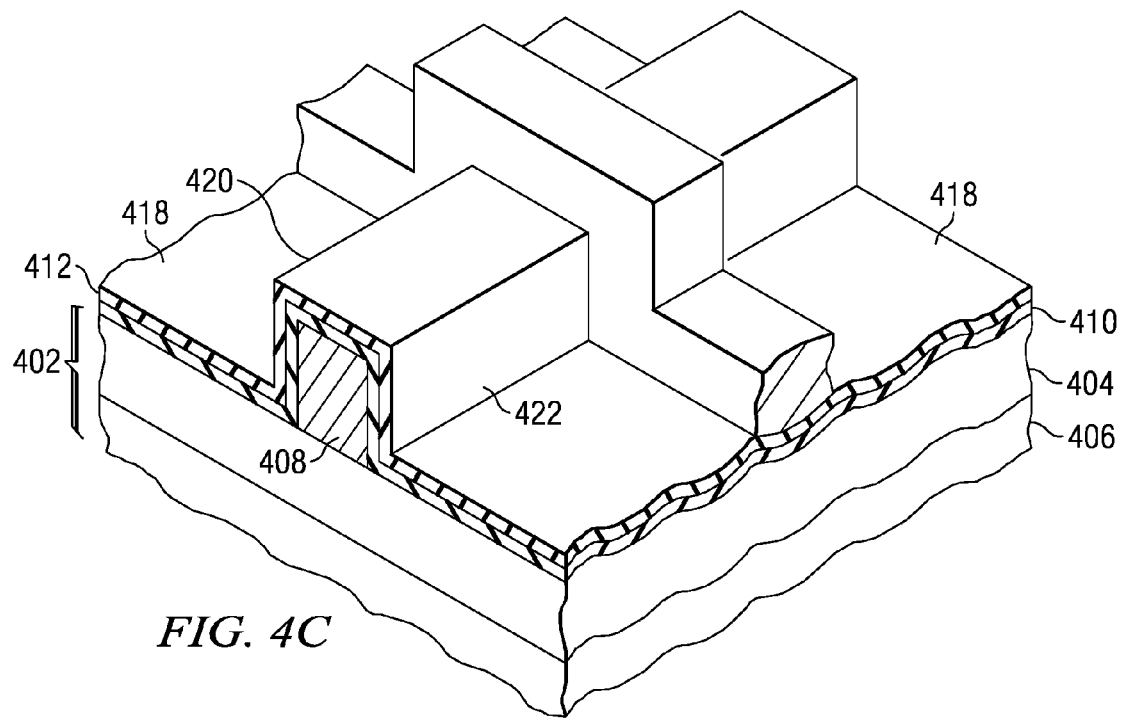

The resulting structure after the first etch is shown in FIG. 4C. Because some metals (e.g., Ti, Ta, etc.) that may be used for the first gate electrode material are reactive, the exposed surface 418 of the first gate electrode 412 may develop an oxide. This oxide could be formed in one of several ways. For example, the oxide could form due to the nature of the first etch 416. In another scenario, the oxide could form due to the first gate electrode layer being exposed to atmospheric conditions (e.g., between metal and poly deposition). Absent countermeasures described herein, the presence of the metal oxide on the exposed surface may make etching the first gate electrode layer more difficult. In particular, metal oxide films are difficult to remove from vertical surfaces (e.g., surfaces 420, 422) during etching of the first gate electrode layer 412.

Figure 4D:
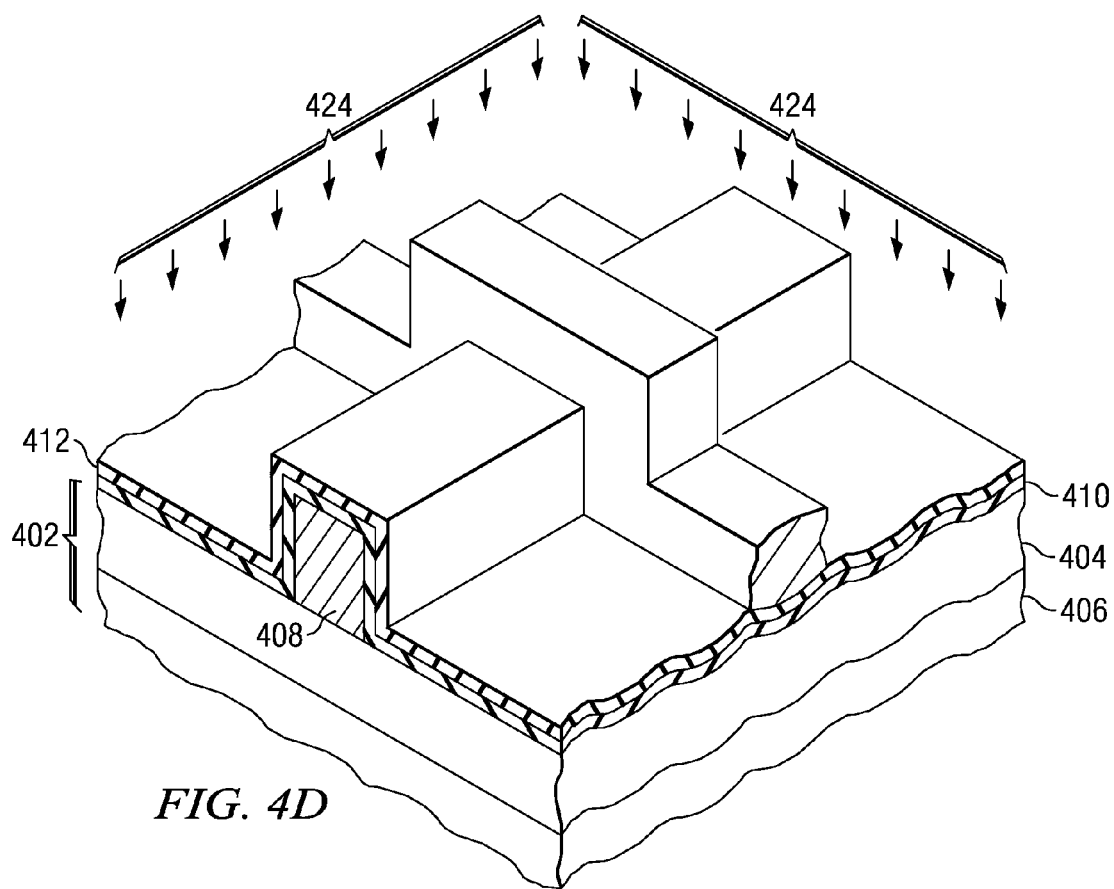

Referring now to FIG. 4D, a stage of manufacture is shown in which a deglaze process 424 is performed to remove the oxide from the exposed surface 418, thereby facilitating subsequent removal of the first gate electrode layer 412. In one embodiment, the deglaze process 424 is a metal deglaze process that is performed to remove the metal oxide film formed on the first gate electrode material. In a particular embodiment, the deglaze process is performed to remove the metal oxide formed on the vertical surfaces of the first gate electrode material. In an exemplary embodiment of the deglaze process, an isotropic dry etch is used to chemically remove the metal oxide. During this dry metal deglaze process, plasma utilizing fluorine chemistry could be used. For example, if the first gate electrode comprises TiN, a $CF_4$ plasma could be used at a low pressure to isotropically remove the oxidized metal film. The process could be controlled by time.

Figure 4E:
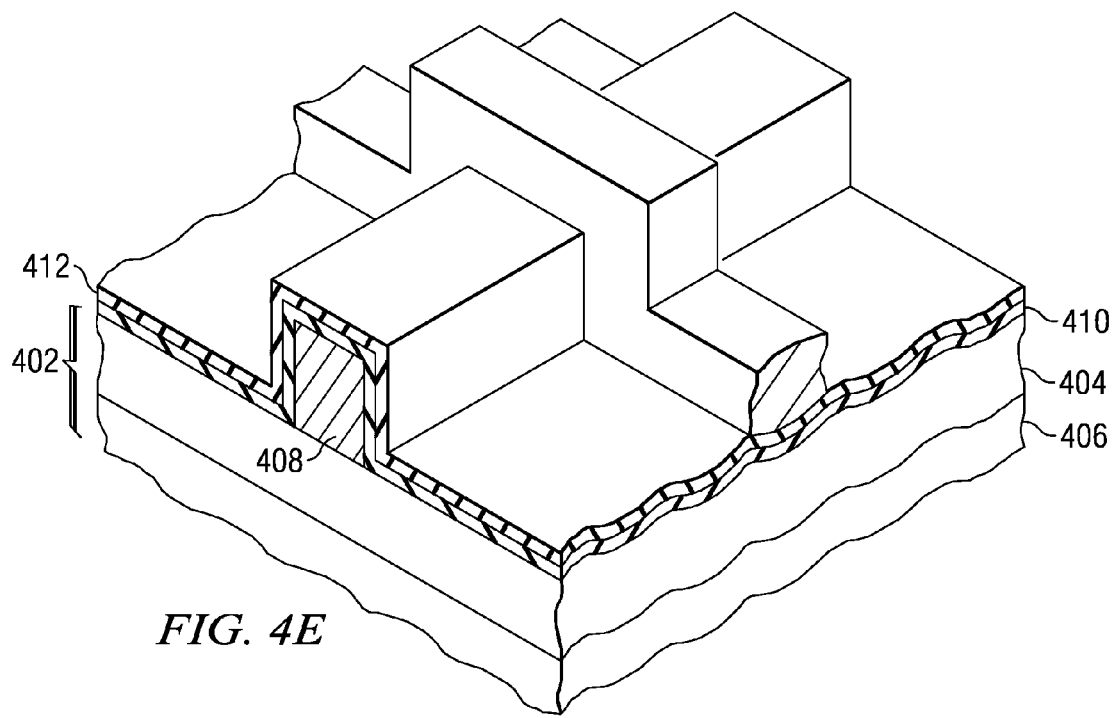

The resulting structure after the deglaze process is shown in FIG. 4E. Notably, the oxide has been "cleaned" from the exposed surface of the first gate electrode layer, and the underlying material (e.g., a metal) is now exposed.

Figure 4F:
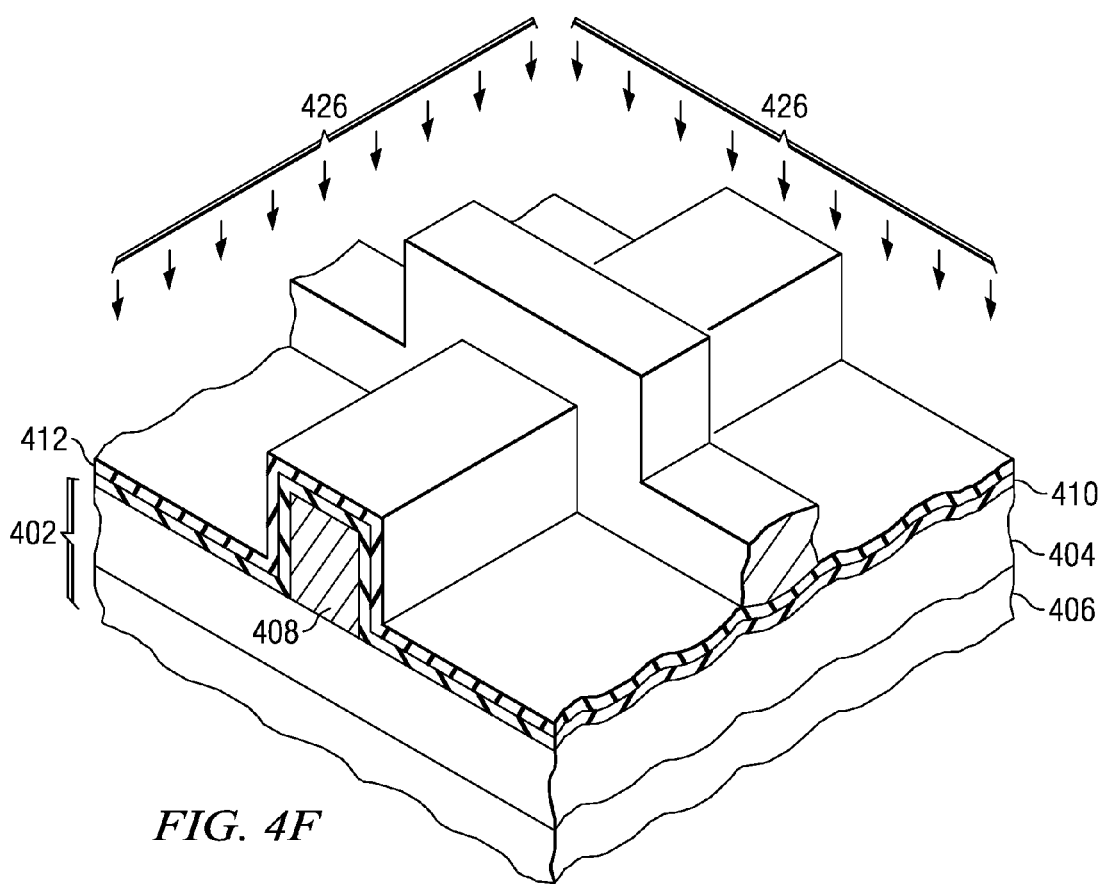

In FIG. 4F, another etch 426 is performed to remove the first gate electrode material 412. In one embodiment, etch 426 is an isotropic etch. Typically, the etch 426 is a dry etch that has a selectivity that is based on the various materials present.

Figure 4G:
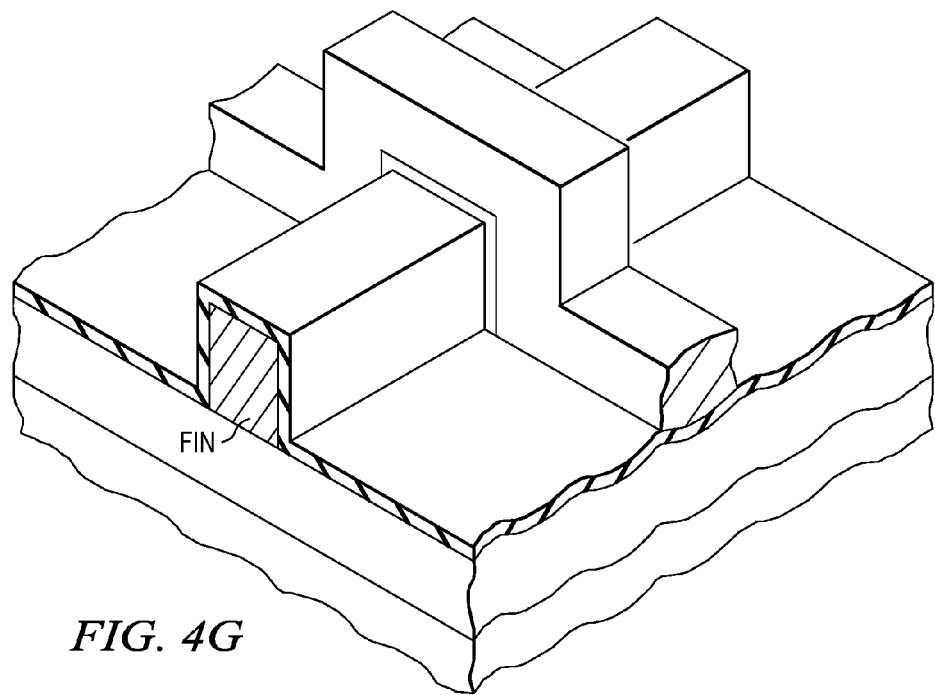

FIG. 4G shows the multi-gate transistor after the etch 426 has been performed. As shown, the etch 426 may leave first gate electrode material under the patterned second gate electrode layer. After the etch 426 is complete, a source and drain can be formed, for example, by doping the regions of the fin on opposite sides of the patterned gate electrode. Other layers (e.g., vias, metal1, metal2, etc.), which are not shown for the purposes of simplicity, may also be formed over the resulting structure.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a multi-gate transistor, the method comprising:
    forming a semiconductor structure over a semiconductor substrate, the semiconductor structure comprising:
        a channel region disposed within a fin of the multi-gate transistor, the channel region disposed between a source and a drain of the multi-gate transistor;
        a gate dielectric disposed about the channel region; and
        a gate electrode disposed about the gate dielectric, the gate electrode including first gate electrode material comprising a metal and second gate electrode material comprising polysilicon;
    selectively removing the second gate electrode material from the semiconductor structure using a dry plasma etch comprising oxygen; thereby exposing a vertically directed surface of the first gate electrode material to formation of metal oxide;
    performing a dry metal deglazing process to chemically remove metal oxide formed on the vertically directed surface of the first gate electrode material; and
    following the deglazing process, selectively removing portions of the first gate electrode material using an isotropic dry etch.

2. The method of claim 1, wherein the first gate electrode material comprises at least one of: Ta, TaN, TaCN, TiN, W, WN, or WSi.

3. The method of claim 1, wherein the deglazing process comprises etching with a fluorine plasma.

4. The method of claim 1, wherein the metal comprises TiN and the deglazing process comprises etching with a $CF_4$ plasma.

5. The method of claim 1, wherein the fin is an undercut fin.

6. A method of fabricating a multi-gate transistor, the method comprising:
    forming a semiconductor fin structure over a substrate;
    forming a dielectric layer over a top horizontal surface and vertical sidewalls of the semiconductor fin structure;
    forming a layer of first gate electrode material comprising metal over the dielectric layer over the top horizontal surface and vertical sidewalls;
    forming a layer of second gate electrode material comprising polysilicon over the layer of first gate electrode material over the top horizontal surface and vertical sidewalls;
    patterning the layer of first gate electrode material and the layer of second gate electrode material to define a gate electrode, including:

selectively etching the second gate electrode material using a first isotropic dry etch including oxygen;

performing a dry deglazing process to chemically remove metal oxide from vertically directed portions of the first gate electrode material; and following the deglazing process, selectively etching the first gate electrode material using a second isotropic dry etch.

7. The method of claim 6, wherein the first gate electrode material comprises a midgap metal.

8. The method of claim 6, wherein the first gate electrode metal comprises a metal selected from the group consisting of Ta, TaN, TaCN, TiN, W, WN, WSi.

9. The method of claim 6, wherein the deglazing process comprises a plasma dry etch utilizing fluorine chemistry.

10. The method of claim 6, wherein the first gate electrode metal comprises TiN; and the deglazing process comprises a dry etch utilizing a $CF_4$ plasma.

11. The method of claim 6, further comprising forming a source and a drain by doping regions of the fin structure on opposite sides of the gate electrode.

12. In a method of fabricating a multi-gate transistor including forming a fin over a substrate, forming a dielectric layer over the fin; forming a metal layer over the dielectric layer over the fin; forming a polysilicon layer over the metal layer over the fin; patterning the polysilicon and metal layers through successive different selective isotropic plasma dry etches to define a gate electrode; and doping the fin on opposite sides of the gate structure to form a source and a drain; wherein the dry etch of the polysilicon layer exposes the metal layer to oxygen; the improvement comprising performing a dry etch chemical deglazing process following the plasma dry etch of the polysilicon layer to chemically remove metal oxide formed on exposed vertically directed portions of the metal layer prior to the plasma dry etch of the metal layer.

13. The improvement of claim 12, wherein the metal is a midgap metal and the deglazing comprises a fluorine chemistry.

14. The improvement of claim 12, wherein the metal comprises TiN and the fluorine chemistry comprises $CF_4$.

* * * * *